(12) United States Patent
Taylor

(10) Patent No.: US 7,776,760 B2
(45) Date of Patent: Aug. 17, 2010

(54) SYSTEMS AND METHODS FOR NANOWIRE GROWTH

(75) Inventor: David Taylor, Belmont, CA (US)

(73) Assignee: Nanosys, Inc., Palo Alto, CA (US)

( * ) Notice: Subject to any disclaimer, the term of this patent is extended or adjusted under 35 U.S.C. 154(b) by 144 days.

(21) Appl. No.: 11/935,884

(22) Filed: Nov. 6, 2007

(65) Prior Publication Data

US 2009/0127540 A1 May 21, 2009

Related U.S. Application Data

(60) Provisional application No. 60/857,450, filed on Nov. 7, 2006.

(51) Int. Cl.
H01L 21/00 (2006.01)
(52) U.S. Cl. .................. 438/758; 900/762; 900/932; 900/890; 257/E21.002
(58) Field of Classification Search ............ 438/758; 257/E21.001, E21.002; 977/890, 891, 762, 977/784, 932
See application file for complete search history.

(56) References Cited

U.S. PATENT DOCUMENTS

| | | |
|---|---|---|
| 5,196,396 A | 3/1993 | Lieber |
| 5,252,835 A | 10/1993 | Lieber et al. |
| 5,274,602 A | 12/1993 | Glenn et al. |
| 5,332,910 A | 7/1994 | Haraguchi et al. |
| 5,338,430 A | 8/1994 | Parsonage et al. |
| 5,505,928 A | 4/1996 | Alivisatos et al. |
| 5,512,131 A | 4/1996 | Kumar et al. |
| 5,640,343 A | 6/1997 | Gallagher et al. |
| 5,674,592 A | 10/1997 | Clark et al. |
| 5,690,807 A | 11/1997 | Clark, Jr. et al. |
| 5,751,018 A | 5/1998 | Alivisatos et al. |
| 5,840,435 A | 11/1998 | Lieber et al. |

(Continued)

FOREIGN PATENT DOCUMENTS

| | | |
|---|---|---|
| WO | 9629629 | 9/1996 |
| WO | 0103208 | 1/2001 |
| WO | 0217362 | 2/2002 |
| WO | 0248701 | 6/2002 |
| WO | 02080280 | 10/2002 |
| WO | 03085700 | 10/2003 |
| WO | 03085701 | 10/2003 |
| WO | 2004032191 | 4/2004 |
| WO | 2004032193 | 4/2004 |
| WO | 2005023923 | 3/2005 |

OTHER PUBLICATIONS

Sharma, S. et al. "Diameter control if Ti-catalyzed silicon nanowires" J. Cryst. Growth (2004) 267:613-618.

(Continued)

*Primary Examiner*—Matthew Smith
*Assistant Examiner*—Michele Fan
(74) *Attorney, Agent, or Firm*—Andrew L. Filler; Donna M. Fabian

(57) ABSTRACT

The present invention is directed to systems and methods for nanowire growth. In an embodiment, methods for nanowire growth and doping are provided, including methods for epitaxial vertically oriented nanowire growth including providing a substrate material having one or more nucleating particles deposited thereon in a reaction chamber, introducing an etchant gas into the reaction chamber at a first temperature which gas aids in cleaning the surface of the substrate material, contacting the nucleating particles with at least a first precursor gas to initiate nanowire growth, and heating the alloy droplet to a second temperature, whereby nanowires are grown at the site of the nucleating particles. The etchant gas may also be introduced into the reaction chamber during growth of the wires to provide nanowires with low taper.

6 Claims, 4 Drawing Sheets

U.S. PATENT DOCUMENTS

| | | | |
|---|---|---|---|
| 5,858,862 | A | 1/1999 | Westwater et al. |
| 5,897,945 | A | 4/1999 | Lieber et al. |
| 5,953,595 | A | 9/1999 | Gosain et al. |
| 5,962,863 | A | 10/1999 | Russell et al. |
| 5,976,957 | A | 11/1999 | Westwater et al. |
| 5,990,479 | A | 11/1999 | Weiss et al. |
| 5,997,832 | A | 12/1999 | Lieber et al. |
| 6,004,444 | A | 12/1999 | Aksay et al. |
| 6,036,774 | A | 3/2000 | Lieber et al. |
| 6,048,616 | A | 4/2000 | Gallagher et al. |
| 6,128,214 | A | 10/2000 | Kuekes et al. |
| 6,136,156 | A | 10/2000 | El-Shall et al. |
| 6,159,742 | A | 12/2000 | Lieber et al. |
| 6,190,634 | B1 | 2/2001 | Lieber et al. |
| 6,207,229 | B1 | 3/2001 | Bawendi et al. |
| 6,225,198 | B1 | 5/2001 | Alivisatos et al. |
| 6,235,675 | B1 | 5/2001 | McIlroy |
| 6,248,674 | B1 | 6/2001 | Kamins et al. |
| 6,256,767 | B1 | 7/2001 | Kuekes et al. |
| 6,274,007 | B1 | 8/2001 | Smirnov et al. |
| 6,306,736 | B1 | 10/2001 | Alivisatos et al. |
| 6,322,901 | B1 | 11/2001 | Bawendi et al. |
| 6,329,214 | B1 | 12/2001 | Hattori et al. |
| 6,339,281 | B2 | 1/2002 | Lee et al. |
| 6,380,103 | B2 | 4/2002 | Gonzalez et al. |
| 6,383,923 | B1 | 5/2002 | Brown et al. |
| 6,413,489 | B1 | 7/2002 | Ying et al. |
| 6,438,025 | B1 | 8/2002 | Skarupo |
| 6,447,663 | B1 | 9/2002 | Lee et al. |
| 6,471,761 | B2 | 10/2002 | Fan et al. |
| 6,566,704 | B2 | 5/2003 | Choi et al. |
| 6,586,785 | B2 | 7/2003 | Flagan et al. |
| 6,760,245 | B2 | 7/2004 | Eaton et al. |
| 6,773,616 | B1 | 8/2004 | Chen et al. |
| 6,798,000 | B2 | 9/2004 | Luyken et al. |
| 6,815,218 | B1 | 11/2004 | Jacobson et al. |
| 6,815,750 | B1 | 11/2004 | Kamins |
| 6,831,017 | B1 | 12/2004 | Li et al. |
| 6,858,455 | B2 | 2/2005 | Guillom et al. |
| 6,872,645 | B2 | 3/2005 | Duan et al. |
| 6,878,871 | B2 | 4/2005 | Scher et al. |
| 6,882,051 | B2 | 4/2005 | Majumdar et al. |
| 6,962,823 | B2 | 11/2005 | Empedocles et al. |
| 7,051,945 | B2 | 5/2006 | Empedocles et al. |
| 7,067,328 | B2 | 6/2006 | Dubrow et al. |
| 7,105,428 | B2 | 9/2006 | Pan et al. |
| 7,129,554 | B2 | 10/2006 | Lieber et al. |
| 2001/0023986 | A1 | 9/2001 | Mancevski |
| 2002/0014667 | A1 | 2/2002 | Shin et al. |
| 2002/0117659 | A1 | 8/2002 | Lieber et al. |
| 2002/0125192 | A1 | 9/2002 | Lopez et al. |
| 2002/0127495 | A1 | 9/2002 | Scherer |
| 2002/0130311 | A1 | 9/2002 | Lieber et al. |
| 2002/0130353 | A1 | 9/2002 | Lieber et al. |
| 2002/0158342 | A1 | 10/2002 | Tuominen et al. |
| 2002/0163079 | A1 | 11/2002 | Awano |
| 2002/0175408 | A1 | 11/2002 | Majumdar et al. |
| 2003/0012723 | A1 | 1/2003 | Clarke |
| 2003/0042562 | A1 | 3/2003 | Giebeler et al. |
| 2003/0044777 | A1 | 3/2003 | Beattie |
| 2003/0071246 | A1 | 4/2003 | Grigorov |
| 2003/0089899 | A1 | 5/2003 | Lieber et al. |
| 2003/0121887 | A1 | 7/2003 | Garvey et al. |
| 2003/0186522 | A1 | 10/2003 | Duan et al. |
| 2003/0189202 | A1 | 10/2003 | Li et al. |
| 2004/0005258 | A1 | 1/2004 | Fonash et al. |
| 2004/0026684 | A1 | 2/2004 | Empedocles |
| 2004/0031975 | A1 | 2/2004 | Kern et al. |
| 2004/0036126 | A1 | 2/2004 | Chau et al. |
| 2004/0036128 | A1 | 2/2004 | Zhang et al. |
| 2004/0061422 | A1 | 4/2004 | Avouris et al. |
| 2004/0095658 | A1 | 5/2004 | Buretea et al. |
| 2004/0112964 | A1 | 6/2004 | Empedocles et al. |
| 2004/0135951 | A1 | 7/2004 | Stumbo et al. |
| 2004/0146560 | A1 | 7/2004 | Whiteford et al. |
| 2005/0064618 | A1 | 3/2005 | Brown et al. |
| 2005/0066883 | A1 | 3/2005 | Dubrow et al. |
| 2005/0079659 | A1 | 4/2005 | Duan et al. |
| 2005/0089467 | A1 | 4/2005 | Grill et al. |
| 2005/0133476 | A1 | 6/2005 | Islam et al. |
| 2005/0145596 | A1 | 7/2005 | Metz et al. |
| 2005/0266662 | A1 | 12/2005 | Yi |
| 2005/0279274 | A1 | 12/2005 | Niu et al. |
| 2006/0019472 | A1* | 1/2006 | Pan et al. .................... 438/486 |
| 2006/0175601 | A1* | 8/2006 | Lieber et al. .................. 257/19 |
| 2007/0037365 | A1 | 2/2007 | Ranganath et al. |
| 2007/0186627 | A1* | 8/2007 | Yi et al. ....................... 73/105 |

OTHER PUBLICATIONS

Bachtold A. et al. "Logic Circuits with Carbon Nanotube Transistors" Science (2001) 294:1317-1320.

Bjork M.T. et al. "One-dimensional steeplechase for electrons realized" Nano Letters (2002) 2:86-90.

Cao Y. et al. "Growth and properties of semiconductor core/shell nanocrystals with InAs cores" J. Am. Chem. Soc. (2000) 122:9692-9702.

Chen J. et al. "Observation of a Large On-Off Ratio and Negative Differential Resistance in an Electronic Molecular Switch" Science (1999) 286:1550-1552.

Chung S-W. et al. "Silicon Nanowire Devices" App. Phys. Letts. (2000) 76(15):2068-2070.

Collier C.P. et al. "Electronically Configurable Molecular-Based Logic Gates" Science (1999) 285:391-394.

Cui Y. et al. "Doping and electrical transport in silicon nanowires" J. Phys. Chem. B (2000) 104:5213-5216.

Cui Y. et al. "Diameter-controlled synthesis of single-crystal silicon nanowires" Appl. Phys. Lett. (2001) 78:2214-2216.

Cui Y. et al. "Functional Nanoscale electronic devices assembled using silicon nanowire building blocks" Science (2001) 291:851-853.

Dabbousi B.O. et al. "(CdSe)ZnS core-shell quantum dots: Synthesis and characterization of a size series of highly luminescent nanocrysallites" J. Phys. Chem. B (1997) 101:9463-9475.

Derycke V. et al. "Carbon Nanotube Inter-and Intramolecular Logic Gates" Nano Letters (2001) 1(9):453-456.

Duan X. et al. "General synthesis of compound semiconductor nanowires" Adv. Mater. (2000) 12:298-302.

Duan X. et al. "High performance thin-film transistors using semiconductor nanowires and nanoribbons" Nature (2003) 425:274-278.

Givargizov E.I. "Fundamental Aspects of VLS Growth" J. Cryst. Growth (1975) 31:20-30.

Greene L. et al. "Low-temperature wafer scale production of ZnO nanowire arrays" Angew. Chem. Int. Ed. (2003) 42:3031-3034.

Gudiksen M.S. et al "Diameter-selective synthesis of semiconductor nanowires" J. Am. Chem. Soc. (2000) 122:8801-8802.

Gudiksen M.S. et al. "Synthetic control of the diameter and length of single crystal semiconductor nanowires" J. Phys. Chem. B (2001) 105:4062-4064.

Gudiksen M.S. et al. "Growth of nanowire superlattice structures for nanoscale photonics and electronics" Nature (2002) 415:617-620.

Haraguchi K. et al. "Polarization Dependence of Ligh Emitted from GaAs p-n junctions in quantum wire crystals" J. Appl. Phys. (1994) 75(8):4220-4225.

Haraguchi K. et al. "Self Organized Fabrication of Planar GaAs Nanowhisker Arrays" Appl. Phys. Lett. (1996) 69 (3):386-387.

Hiruma K. et al. "GaAs Free Standing Quantum Sized Wires" J. Appl. Phys. (1993) 74(5):3162-3171.

Huang Y. et al. "Directed Assembly of One-Dimensional Nanostructures into Functional networks" Science (2001) 291:630-633.

Huang Y. et al. "Logic Gates and Computation from Assembled Nanowire Building Blocks" Science (2001) 294:1313-1317.

Jun Y-W. et al. "Controlled synthesis of multi-armed CdS nanorod architectures using monosurfactant system" J. Am. Chem. Soc. (2001) 123:5150-5151.

Kong J. et al. "Synthesis of individual single-walled carbon nanotubes on patterned silicon wafers" Nature (1998) 395:878-881.

Kong J. et al. "Chemical vapor deposition of methane for single-walled carbon nanotubes" Chem. Phys. Lett.(1998) 292:567-574.

Kong J. et al. "Nanotube molecular wires as chemical sensors" Science (2000) 287:622-625.

Liu C. et al. "Sol-Gel Synthesis of Free-Standing Ferroelectric Lead Zirconate Titanate Nanoparticles" J. Am. Chem. Soc. (2001) 123:4344-4345.

Manalis S.F. et al. "Microvolume field-effect pH sensor for the scanning probe microscope" Applied Phys. Lett. (2000) 76:1072-1074.

Manna L. et al. "Synthesis of Soluble and Processable Rod-Arrow-Teardrop- and Tetrapod-Shaped CdSe Nanocrystals" J. Am. Chem. Soc. (2000) 122:12700-12706.

Manna L. et al. "Epitaxial growth and photochemical annealing of graded CdS/ZnS shells on colloidal CdSe nanorods" J. Am. Chem. Soc. (2002) 124:7136-7145.

Morales A.M. et al. "A laser ablation method for the synthesis of crystalline semiconductor nanowires" Science (1998) 279:208-211.

Peng X et al. "Epitaxial growth of highly luminescent CdSe/CdS core/shell nanocrystals with photostability and electronic accessibility" J. Am. Chem. Soc. (1997) 119:7019-7029.

Peng X. et al. "Shape Control of CdSe Nanocrystals" Nature (2000) 404:59-61.

Puntes V.F. et al. "Colloidal nanocrystal shape and size control: The case of cobalt" Science (2001) 291:2115-2117.

Schon J.H. et al. "Field-effect modulation of the conductance of single molecules" Science (2001) 294:2138-2140.

Schon J.H. et al. "Self-assembled monolayer organic field-effect transistors" (2001) Nature 413:713-716.

Service R.F. "Assembling nanocircuits from the bottom up" Science (2001) 293:782-785.

Tang et al. "Synthesis of InN Nanowires Using a Two-Zone Chemical Vapor Deposition Approach" IEEE (Aug. 14 2003) 205-207.

Tans S.J. et al. "Room-temperature transistor based on a single carbon nanotube" Nature (1998) 393:49-52.

Thess A. et al. "Crystalline ropes of metallic carbon nanotubes" (1996) Science 273:483-486.

Tseng G.Y. et al. "Toward nanocomputers" (2001) Science 294:1293-1294.

Urban J.J. et al. "Synthesis of single-crystalline perovskite nanowires composed of barium titanate and strontium titanate" J. Am. Chem. Soc. (2002) 124(7):1186-1187.

Wagner R.S. et al. "Vapor-Liquid-Solid mechanism of single crystal growth" Appl. Phys. Lett. (1964) 4(5):89-90.

Wang et al. "Low Temperature Synthesis of Single-Crystal Germanium Nanowires by Chemical Vapor Deposition" Angew. Chem. Int. Ed. (2002) 41(24):4783-4786.

Wu Y et al. "Block-by-block growth of single-crystalline Si/SiGe superlattice nanowires" Nano Letters (2002) 2(2):83-86.

Xiang, J. et al. "Ge/Si nanowire heterostructures as high-performance field-effect transistors" Nature (2006) 441:489-493.

Yamada T. "Analysis of submicron carbon nanotube field-effect transistors" Appl. Phys Letts (2000) 76(5):628-630.

Yazawa M. et al. "Semiconductor nanowhiskers" Adv. Mater.(1993) 5(7/8):577-580.

Yun W.S. et al. "Ferroelectric Properties of Individual Barium Titanate Nanowires Investigated by Scanned Probe Microscopy" Nanoletters (2002) 2(5):447-450.

Zhou C. et al. "Nanoscale metal/self-assembled monolayer/metal heterostructures" Applied Phys. Lett (1997) 71:611-613.

* cited by examiner

SYSTEMS AND METHODS FOR NANOWIRE GROWTH

CROSS REFERENCE TO RELATED APPLICATIONS

This application claims the benefit of the filing date of U.S. Provisional Patent Application No. 60/857,450, filed Nov. 7, 2006, which is incorporated herein by reference in its entirety.

BACKGROUND OF THE INVENTION

The present invention relates to nanowires, and more particularly, to improved methods for nanowire growth.

Nanostructures, and in particular, nanowires have the potential to facilitate a whole new generation of electronic devices. A major impediment to the emergence of this new generation of electronic devices based on nanostructures is the ability to effectively grow nanowires and other nanostructures that have consistent characteristics. Current approaches to growing nanowires do not facilitate mass production and typically do not yield consistent nanowire performance characteristics.

What are needed are systems and methods to grow nanowires that have consistent performance characteristics.

SUMMARY OF THE INVENTION

The present invention provides methods for producing vertically aligned epitaxial nanowires (e.g., silicon nanowires) with uniform characteristics such as low taper, comprising providing a substrate material having one or more nucleating particles deposited thereon in a reaction chamber, introducing an etchant gas into the reaction chamber at a first temperature which gas aids in cleaning the surface of the substrate material (and the nucleating particles), contacting the nucleating particles with at least a first precursor gas to initiate nanowire growth, and heating the substrate material to a second temperature, whereby nanowires are grown at the site of the nucleating particles. The substrate material utilized in the processes of the present invention preferably is crystallographic, but may be amorphous. Suitably, the substrate material comprises crystallographic silicon, either polycrystalline or single crystalline. In other embodiments, the substrate may be amorphous $SiO_2$, $Si_3N_4$, or alumina.

In one presently preferred embodiment, the precursor gas comprises $SiH_4$, but may also comprise other precursor gases such as $Si_2H_6$. In certain suitable embodiments, the first temperature at which the etchant gas is introduced to clean the substrate surface is higher than the second temperature at which nanowire growth occurs in the presence of the precursor gas. Suitably, the first temperature may be at least about 100° C. higher than the second temperature, e.g., about 200° C. higher than the second temperature, and may occur at a temperature of about 800° C., for example. In other embodiments, the first temperature at which the etchant gas is introduced to clean the substrate surface may be about the same as the second temperature at which nanowire growth occurs in the presence of the precursor gas. For example, the first and second temperatures may be about 600° C. The nucleating particles used in the practice of the present invention will suitably be a metal catalyst and will comprise a metal that reacts with the first precursor gas to form a eutectic from which Si may precipitate. Suitable metal catalysts comprise Au, Al, Pt, Fe, Ti, Ga, Ni, Sn or In and in certain such embodiments, may be a Au colloid or Au film.

High quality single crystalline silicon nanowires may then be grown by metal-catalyzed chemical vapor deposition (CVD), for example, which is based on a vapor-liquid solid (VLS) growth process. During growth, the precursor gas (e.g., $SiH_4$) decomposes at the nucleating particle catalyst surface, Si diffuses in the catalyst, then when supersaturation occurs, the Si atoms precipitate out at the catalyst-substrate interface to form a silicon nanowire of diameter similar to that of the catalyst nucleating particle.

In embodiments where crystalline substrates are utilized, the wires growing on the substrate material can preferably grow epitaxially from the substrate. Nanowires produced according to the processes of the present invention grow out of the plane of the substrate material in an axially aligned vertical orientation, and are capable of transporting electrical charge. It has been found that the methods of the present invention provide nanowires having very low taper along their length, for example, have a taper rate of less than about 2 nm/micron, e.g., less than about 1.5 nm/micron, e.g., less than about 1.0 nm/micron, e.g., less than about 0.5 nm/micron, e.g., less than about 0.3 nm/micron along their length.

The first precursor gas utilized in the processes of the present invention will suitably comprise $SiH_4$ (or $Si_2H_6$) and may further comprise one or more dopant gases such as $B_2H_6$, $POCl_3$ or $PH_3$. The precursor gas used in the processes of the present invention may suitably be introduced via plasma enhanced sputter deposition. Sputter deposition can be accomplished via any method known to the ordinarily skilled artisan, for example, diode, radio frequency and direct current deposition.

In another suitable embodiment of the invention, to fully exploit the bottom-up potential of this nanowire growth method, in-situ doping, such as axial dopant modulation, is desirable for complementary metal oxide semiconductor (CMOS) device fabrication. For example, the VLS growth method lends itself well to axial modulation of dopant to allow, e.g., for the doping of only certain portions of the wires (and not the entire length of the wire), e.g., at its ends, with a dopant species such as boron or phosphorus. For example, for building CMOS devices such as transistors using nanowires, in certain cases it is desirable to grow the wires with doped ends where electrode contacts to the wires will be made to improve ohmic contact to the wires. However, it has been shown that the introduction of dopant gases such as diborane and phosphine affects the decomposition rate of silane. Indeed, diborane has been shown to increase and phosphine decrease the decomposition rate of silane. Diborane can thus induce substantial uncatalysed Si deposited on the nanowire sidewalls during growth of the wires which can result in a significant increase in the taper rate along the wires during growth and dopant incorporation.

Accordingly, in another suitable embodiment of the invention, an etchant gas such as hydrogen chloride may also be introduced into the reaction chamber during growth of the nanowires and/or during dopant incorporation. The HCl will produce a relatively low etch rate of the wires at the growth temperature of the wires (e.g., about 600° C. for vertically oriented epitaxial wires), and lead to a passivation layer of Cl on the wires which inhibits the sidewall growth of Si thereby providing good control of wire uniformity (e.g., wires with low taper), and further sterically hindering sidewall incorporation of dopant allowing for axially modulated electronic doping of the vertically aligned epitaxial wires. In the embodiment whereby the etchant gas, such as hydrogen chloride, is introduced into the reaction chamber both in the preclean step noted above as well as during growth of the wires and/or dopant incorporation, typically the partial pressure of HCl during the preclean step is higher (e.g., about 1.0 Torr) than the partial pressure of HCl introduced into the reaction chamber during the nanowire growth process (e.g., about 0.15 Torr) to minimize over-etching of the wires during growth.

By way of further example, according to another aspect of the invention, the teachings of the present invention further allow the synthesis of nanowires with different materials longitudinally along the length of the nanowire, such as would be the case with alternating or periodic segments of different materials or multi-segmented nanowires where at least two of the segments comprise different materials. An example of this would be where adjacent segments have different chemical compositions, such as Si, Ge and/or SiGe. The use of HCl during the nanowire growth process of these different segments will produce a very low etch rate and lead to a passivation layer of Cl which inhibits the sidewall decomposition of $SiH_4$ or $GeH_4$, providing improved control of the Si/Ge and $Si_xGe_{(1-x)}$ axial modulation of vertically aligned heterostructure nanowires with very low taper. It will be appreciated that various other nanowire structures using different semiconductor materials (e.g., such as PbSe) can also be grown using different precursor gases for those other materials.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

Figure 1A:
FIG. 1A is a diagram of a single crystal semiconductor nanowire.

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires.

It should be appreciated that although nanowires are frequently referred to, the techniques described herein may also be applicable to other nanostructures, such as nanorods, nanotubes, nanotetrapods, nanoribbons and/or combinations thereof. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, an "aspect ratio" is the length of a first axis of a nanostructure divided by the average of the lengths of the second and third axes of the nanostructure, where the second and third axes are the two axes whose lengths are most nearly equal to each other. For example, the aspect ratio for a perfect rod would be the length of its long axis divided by the diameter of a cross-section perpendicular to (normal to) the long axis.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanostructure to be considered a heterostructure. For example, a nanocrystal characterized by a core of one material covered with small islands of a second material is a heterostructure. In other embodiments, the different material types are distributed at different locations within the nanostructure. For example, material types can be distributed along the major (long) axis of a nanowire or along a long axis or arm of a branched nanocrystal. Different regions within a heterostructure can comprise entirely different materials, or the different regions can comprise a same base material.

As used herein, a "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g., heterostructures). Nanostructures can be, for example, substantially crystalline, substantially monocrystalline, polycrystalline, amorphous, or a combination thereof. In one aspect, each of the three dimensions of the nanostructure has a dimension of less than about 500 nm, for example, less than about 200 nm, less than about 100 nm, less than about 50 nm, or even less than about 20 nm.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length:width) of greater than 10, preferably greater than 50, and more preferably, greater than 100.

The nanowires of this invention can be substantially homogeneous in material properties, or in certain embodiments can be heterogeneous (e.g. nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g. over the central 20%, 40%, 50%, or 80% of the nanowire). A nanowire can be straight or can be e.g. curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

A wide range of types of materials for nanowires, nanorods, nanotubes and nanoribbons can be used, including semiconductor material selected from, e.g., Si, Ge, Sn, Se, Te, B, C (including diamond), P, B—C, B—P(BP$_6$), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN$_2$, CaCN$_2$, ZnGeP$_2$, CdSnAs$_2$, ZnSnSb$_2$, CuGeP$_3$, CuSi$_2$P$_3$, (Cu, Ag)(Al, Ga, In, Ti, Fe)(S, Se, Te)$_2$, Si$_3$N$_4$, Ge$_3$N$_4$, Al$_2$O$_3$, (Al, Ga, In)$_2$ (S, Se, Te)$_3$, Al$_2$CO, and an appropriate combination of two or more such semiconductors.

The nanowires can also be formed from other materials such as metals such as gold, nickel, palladium, iradium, cobalt, chromium, aluminum, titanium, tin and the like, metal alloys, polymers, conductive polymers, ceramics, and/or combinations thereof. Other now known or later developed conducting or semiconductor materials can be employed.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te. Other now known or later developed dopant materials can be employed.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

As used herein, the term "taper rate" refers to the diameter of an elongated nanostructure (such as a nanowire) as measured from its bottom end portion less the diameter of the nanostructure as measured from its top end portion, divided by the length of the nanostructure.

It should be understood that the spatial descriptions (e.g., "above", "below", "up", "down", "top", "bottom," etc.) made herein are for purposes of illustration only, and that devices of the present invention can be spatially arranged in any orientation or manner.

Types of Nanowires and Their Synthesis

FIG. 1A illustrates a single crystal semiconductor nanowire core (hereafter "nanowire") 100. FIG. 1A shows a nanowire 100 that is a uniformly doped single crystal nanowire. Such single crystal nanowires can be doped into either p- or n-type semiconductors in a fairly controlled way. Doped nanowires such as nanowire 100 exhibit improved electronic properties. For instance, such nanowires can be doped to have carrier mobility levels comparable to bulk single crystal materials.

Figure 1B:
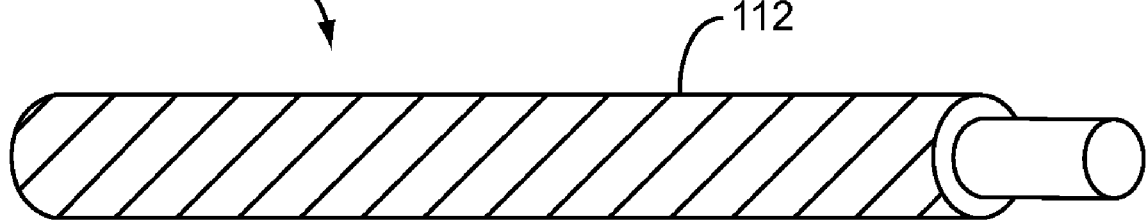
FIG. 1B is a diagram of a nanowire doped according to a core-shell structure.

FIG. 1B shows a nanowire 110 having a core-shell structure. Surface scattering can be reduced by forming an outer layer of the nanowire, such as by the passivation annealing of nanowires, and/or the use of core-shell structures with nanowires. An insulating layer, such as an oxide coating, can be formed on a nanowire as the shell layer. Furthermore, for example, for silicon nanowires having an oxide coating, the annealing of the nanowires in hydrogen (H$_2$) can greatly reduce surface states. In embodiments, the core-shell combination is configured to satisfy the following constraints: (1) the shell energy level should be higher than the core energy level, so that the conducting carriers are confined in the core; and (2) the core and shell materials should have good lattice match, with few surface states and surface charges. Other more complex NW core-shell structures may also be used to include a core of single crystal semiconductor, an inner-shell of gate dielectric, and an outer-shell of conformal gate. This can be realized by depositing a layer of TaAlN, WN, or highly-doped amorphous silicon around the Si/SiO$_x$ core-shell structure (described above) as the outer-gate shell, for example.

The valence band of the insulating shell can be lower than the valence band of the core for p-type doped wires, or the conduction band of the shell can be higher than the core for n-type doped wires. Generally, the core nanostructure can be made from any metallic or semiconductor material, and the one or more shell layers deposited on the core can be made from the same or a different material. For example, the first core material can comprise a first semiconductor selected from the group consisting of: a Group II-VI semiconductor, a Group III-V semiconductor, a Group IV semiconductor, and an alloy thereof. Similarly, the second material of the one or more shell layers can comprise an oxide layer, a second semiconductor, the same as or different from the first semiconductor, e.g., selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe. As noted above, metallic materials such as gold, chromium, tin, nickel, aluminum etc. and alloys thereof can be used as the core material, and the metallic core can be overcoated with an appropriate shell material such as silicon dioxide or other insulating materials, which may in turn may be coated with one or more additional shell layers of the materials described above to form more complex core-shell-shell nanowire structures.

Nanostructures can be fabricated and their size can be controlled by any of a number of convenient methods that can be adapted to different materials. For example, synthesis of nanocrystals of various composition is described in, e.g., Peng et al. (2000) "Shape Control of CdSe Nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" *J. Am. Chem. Soc.* 122, 8801-8802; Cui et al. (2001) "Diameter-controlled synthesis of single-crystal silicon nanowires" *Appl. Phys. Lett.* 78, 2214-2216; Gudiksen et al. (2001) "Synthetic control of the diameter and length of single crystal semiconductor nanowires" *J. Phys. Chem. B* 105, 4062-4064; Morales et al. (1998) "A laser ablation method for the synthesis of crystalline semiconductor nanowires" *Science* 279, 208-211; Duan et al. (2000) "General synthesis of compound semiconductor nanowires" *Adv. Mater.* 12, 298-302; Cui et al. (2000) "Doping and electrical transport in silicon nanowires" *J. Phys. Chem. B* 104, 5213-5216; Peng et al. (2000) "Shape control of CdSe nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urban et al. (2002) "Synthesis of single-crystalline perovskite nanowires composed of barium titanate and strontium titanate" *J. Am. Chem. Soc.*, 124, 1186; and Yun et al. (2002) "Ferroelectric Properties of Individual Barium Titanate Nanowires Investigated by Scanned Probe Microscopy" *Nanoletters* 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123, 5150-5151; and Manna et al. (2000) "*Synthesis of Soluble and Processable Rod-, Arrow-, Teardrop-, and Tetrapod-Shaped CdSe Nanocrystals*" J. Am. Chem. Soc. 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413,489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., U.S. Pat. No. 6,882,051; Peng et al. (1997) "Epitaxial growth of highly luminescent CdSe/CdS core/shell nanocrystals with photostability and electrical accessibility" *J. Am. Chem. Soc.* 119, 7019-7029; Dabbousi et al. (1997) "(CdSe)ZnS core-shell quantum dots: Synthesis and characterization of a size series of highly luminescent nanocrysallites" *J. Phys. Chem. B* 101, 9463-9475; Manna et al. (2002) "Epitaxial growth and photochemical annealing of graded CdS/ZnS shells on colloidal CdSe nanorods" *J. Am. Chem. Soc.* 124, 7136-7145; and Cao et al. (2000) "Growth and properties of semiconductor core/shell nanocrystals with InAs cores" *J. Am. Chem. Soc.* 122, 9692-9702. Similar approaches can be applied to growth of other core-shell nanostructures.

Growth of nanowire heterostructures in which the different materials are distributed at different locations along the long axis of the nanowire is described in, e.g., U.S. Pat. No. 6,882,051; Gudiksen et al. (2002) "Growth of nanowire superlattice structures for nanoscale photonics and electronics" *Nature* 415, 617-620; Bjork et al. (2002) "One-dimensional steeplechase for electrons realized" *Nano Letters* 2, 86-90; Wu et al. (2002) "Block-by-block growth of single-crystalline Si/SiGe superlattice nanowires" *Nano Letters* 2, 83-86; and U.S. Pat. No. 7,067,867. Similar approaches can be applied to growth of other heterostructures.

Epitaxial-Oriented Nanowire Growth Using an Etchant Pre-Clean Step

High-quality single crystalline nanowires such as silicon nanowires are commonly grown by metal-catalyzed chemical vapor deposition (CVD). During this vapor-liquid-solid (VLS) growth process, nanosized metal catalysts, such as gold nucleating particles, are used to catalyze the decomposition of a precursor gas such as silane (SiH4). A liquid Au—Si alloy is formed and when supersaturation is reached, silicon precipitates out to form a silicon nanowire of diameter similar to that of the catalyst particle. The preferred nanowire growth direction for this method may comprise <111>, <110> and <112>.

For many processes, vertically aligned nanowire growth is highly desirable to produce devices such as transistors with consistent performance characteristics. Such orientation may be realized by epitaxial growth on single-crystalline substrates with suitable crystal structure (e.g., Si (111) wafers). Epitaxial growth requires a clean interface between the nucleating particles (e.g., Au particles) and the substrate. The native oxide (SiOx) may be removed prior to growth with a hydrofluoric (HF) acid etch as is known in the art. Unfortunately, in most cases, low yield epitaxial growth of vertically oriented silicon nanowires nucleated from gold nanoparticles is observed and other surface cleaning treatments are necessary.

In addition, at growth temperatures required for epitaxial silicon nanowire growth, uncatalysed thermal decomposition of the silane occurs leading to sidewall growth of silicon producing tapered nanowires. The silicon added to the sidewall of the nanowires can be a combination of polysilicon, amorphous silicon, and/or epitaxial silicon depending on the growth conditions. Forms of silicon other than epitaxial silicon are undesirable since they can spoil the intrinsic electronic properties of the wires. It is desirable to be able to grow nanowires such as silicon nanowires that have reduced taper in order to produce devices based on such wires with consistent performance characteristics.

Figure 2:
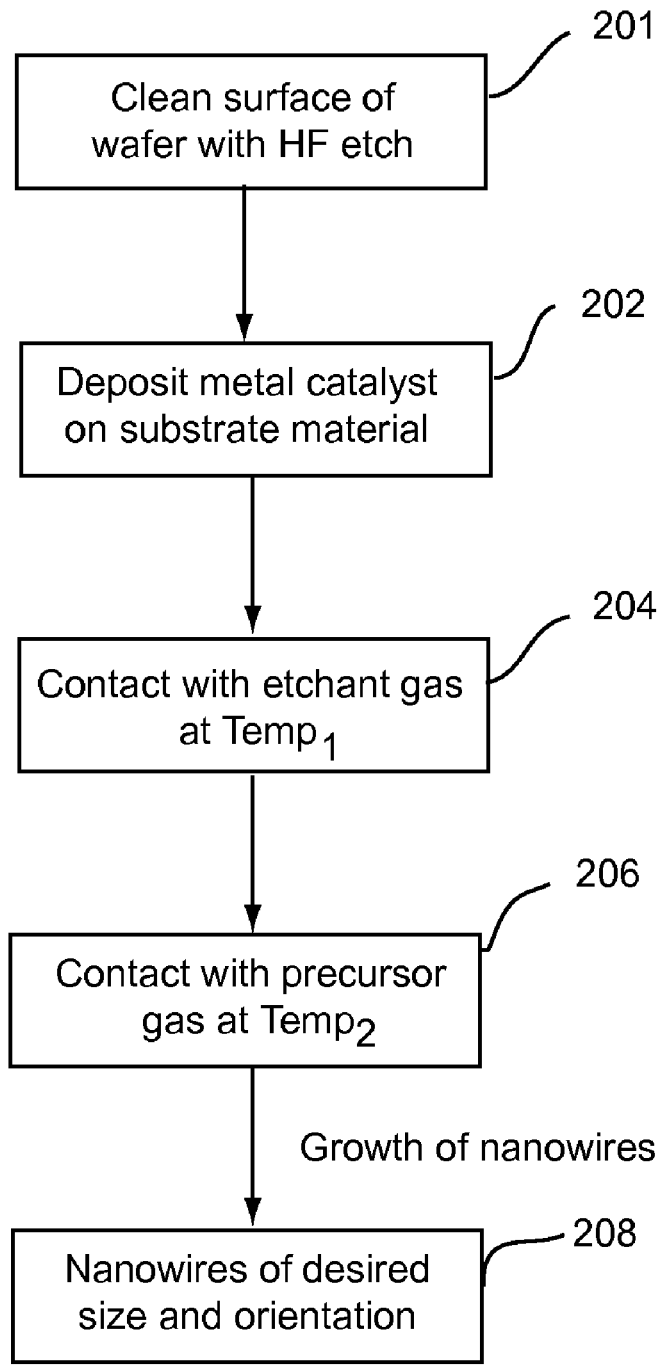
FIG. 2 is a flowchart of a method for preparing nanowires using an HCl preclean according to an embodiment of the invention.

FIG. 2 is a flowchart of method 200 for preparing nanowires using a hydrogen chloride pre-clean step according to an embodiment of the invention. Method 200 begins in step 201. In step 201, the surface of a wafer, such as a silicon wafer, is first passivated with a hydrofluoric acid gas etchant to remove the native oxide (e.g., SiOx) from the wafer surface prior to depositing nucleating particles on the substrate surface. In step 202, one or more nucleating particles, suitably metal catalysts such as Au colloid particles, are deposited on a substrate material to create nucleation sites for nanowire growth. As shown in step 204, following deposition of the nucleating particles on the substrate, the substrate is heated to a first temperature in a reaction chamber and an etchant gas, e.g., hydrogen chloride gas, is introduced into the reaction chamber to clean the substrate surface coated with the nucleating particles. The etchant gas aids in cleaning both the substrate surface as well as the nucleating particles on the substrate surface. Next, heating of the nucleating particles to a second temperature (which may be the same as or lower than the first temperature) and contacting the nucleating particles with a first precursor gas (e.g., silane), creates a liquid alloy droplet and initiates nanowire growth, which is indicated by label 206, until they reach the desired size and orientation, as shown in step 208.

In suitable embodiments, the substrate material on which the nanowires are grown is a crystallographic substrate. The term "crystallographic substrate" includes any substrate material which comprises atoms situated in a repeating or periodic array over large atomic distances, typically on the order of 10 or more angstroms (Å). Such crystallographic substrates may be polycrystalline or may comprise single crystals. Suitably, the crystallographic substrate utilized in the processes of the present invention is silicon (Si). Other suitable crystallographic materials include, but are not limited to, germanium (Ge), gallium arsenide (GaAs), gallium nitride (GaN), sapphire, quartz, and silicon germanium (SiGe). In other embodiments of the present invention, the substrate material may comprise an amorphous material. Suitable amorphous substrate materials which may be used in the practice of the present invention include, but are not limited to $SiO_2$, $Si_3N_4$ and alumina.

As outlined in FIG. 2, in certain embodiments, the methods of the present invention comprise first depositing nucleating particles on a substrate material. Nucleating particles that may be used in the practice of the present invention include metal catalysts and can be any metal that reacts with the precursor gas to form a eutectic phase. Such a mixture has a minimum melting point at which all components are in solution. Upon addition of precursor gas molecules (e.g., silicon) a saturation point on the eutectic phase diagram is reached such that semiconductor particles (e.g., Si) begin to precipitate out of the metal alloy, thereby creating a growing nanowire. Continuous addition of precursor gas will continue to saturate the eutectic, thereby generating additional material for nanowire growth.

In suitable embodiments, the nucleating particles will be metal catalysts and can comprise any of the transition metals from the Periodic Table, including, but not limited to, copper, silver, gold, nickel, palladium, platinum, cobalt, rhodium, iridium, indium, iron, ruthenium, tin, osmium, manganese, chromium, molybdenum, tungsten, vanadium, niobium, tantalum, titanium, zirconium and gallium, including mixtures of one or more of these metals. In preferred embodiments of the present invention, the metal catalyst can comprise a gold (Au) colloid (i.e., a Au nanoparticle) or Au film. In certain such embodiments, 20 to 150 nanometer (nm) diameter gold colloids can be used. The target is to achieve a uniform deposition of gold nanoparticles with density between about 0.14 to 6 particles per square micrometer (μm). A key is minimized gold particle cluster formation. The clusters can result in undesired larger diameter nanowire growth. Spin coating and self assembly methods can be explored for the deposition (see, e.g., U.S. Pat. No. 7,067,867 which is incorporated by reference herein in its entirety).

Spin coating is a fairly straightforward process. A deposition density can be controlled through variation of the gold particle concentration in the precursor colloids, manipulation of surface chemistry of the silicon wafer, and changing the spin speed. A drawback of spin coating can be low utilization efficiency of gold colloid solution. A recycling process in the production stage can be used if warranted.

Self assembly involves some use of well established chemistry. The surface of 4 inch silicon oxide coated wafer is functionalized with either (3-aminopropyl)-trimethoxysilane (APTES) or (3-mercaptopropyl)-trimethoxysilane (MPTES), then contacted with gold colloid solution. The gold particles are assembled on the surface. The difference between two different chemistries are compared, and the possibility of controlling the density of gold particles by control of the contact time and gold particle concentration in the contact solution can be used.

The nucleating particles used to practice the present invention can also be formed on a substrate surface by heating a gold film coating layer on the surface.

In one embodiment, the present invention comprises heating the first precursor gas to a temperature at which 1) the gas dissociates into its free component atoms, and 2) the nucleating particles (e.g. metal catalyst) melts to a liquid. The free gas molecules can then diffuse into the metal catalyst to form a liquid alloy droplet. This process is commonly known to those of ordinary skill in the art as chemical vapor deposition (CVD).

In suitable embodiments of the present invention, the first precursor gas may be selected from, but not limited to, $SiH_4$ or $Si_2H_6$. Heating these Si precursor gases above the temperature at which the thermal energy is sufficient to break the bond energies between the gaseous molecules generates free Si atoms (e.g., Si—H bond: 93 kcal/mole, Si—Cl bond: 110 kcal/mole, Si—Si bond; 77 kcal/mole, see M. T. Swihart and R. W. Carr, *J. Phys Chem A* 102:1542-1549 (1998).) Provided that this temperature is also high enough to liquefy the metal catalyst, the free Si atoms will diffuse into the metal and generate a eutectic phase. Dissociation temperatures for $Si_2H_6$ and $SiH_4$ are between about 300° C. to 500° C., respectively, and preferably growth occurs at a temperature of about 600° C. to produce vertically oriented epitaxial wires.

In all embodiments of the present invention, the precursor gas used during any of the nanowire growth processes may further comprise one or more doping gases. Examples of suitable doping gases that may be used in the practice of the present invention include, but are not limited to, $B_2H_6$, $POCl_3$ and $PH_3$. In many applications of the wires, in situ doping is necessary for complementary metal oxide semiconductor (CMOS) device fabrication. In suitable embodiments of the present invention, wires can be grown using the same doping gas in each of the precursor gas mixtures. In such embodiments, the entire resulting wire will be either p-type or n-type, depending on the choice of dopant. In other embodiments of the present invention, different doping gases can be introduced throughout the process as components of the precursor gas. For example, wire growth can be initiated using a precursor gas comprising an n-type dopant (e.g., P, As or Sb) and then continued using a precursor gas using a p-type dopant (e.g., B, Al or In). In other embodiments, a p-type doing gas will be used during initiation and then an n-type doping gas during growth.

In other embodiments, the type of doping gas can be switched multiple times throughout the growth process as the precursor gases are switched, e.g., for axial modulation doping of the wires. The resulting nanowires therefore can comprise several different dopant portions throughout their length. For example, a nanowire produced via the present invention may comprise an n-type base where electrical contact to a source electrode can be made, a p-type middle section, and an n-type top where electrical contact to a drain electrode may be made, or any suitable combination as envisioned by the ordinarily skilled artisan. Such embodiments of the present invention would allow for an n-type wire to be grown on a p-type substrate, and vice versa.

As discussed above, the VLS growth method lends itself well to axial modulation of dopant to allow, e.g., for the doping of only certain portions of the wires (and not the entire length of the wire), e.g., at its ends, with a dopant species such as boron. In one embodiment of the present invention, for example, the first precursor gas can comprise $SiH_4$ and suitably a carrier gas, such as $H_2$, He, Ar, or other inert gas. Heating this gas mixture to a sufficiently high temperature, e.g., about 600° C., generates free Si atoms. In suitable such embodiments, the first precursor gas may comprise one or more dopant gases selected from those described throughout the application. When a dopant gas such as $B_2H_6$ is present in the precursor gas mixture, B atoms will also be generated.

The first precursor gas mixture is passed over the nucleating particles, suitably metal-catalyst particles (e.g., gold nanoparticles) deposited on the substrate material at a total pressure between about 5 to about 50 Torr, while the nucleating particles are heated up to a temperature of about 600° C. In other embodiments of the present invention, the gas pressure may be increased or decreased, thereby requiring a modification in the temperature required to dissociate the precursor gas mixture.

Si and B will diffuse into the metal catalyst and generate a liquid alloy droplet. This eutectic phase of metal catalyst and precursor gases will continue to exist as precursor gas is solvated in the metal catalyst. Once an over-saturation is reached, Si/B atoms will precipitate out and initiate nanowire growth. In order to continue nanowire growth, a continuous supply of Si precursor gas and doping gas are required. However, it has been shown that the introduction of dopant gases such as diborane and phosphine affects the thermal decomposition rate of silane. Indeed, diborane has been shown to increase and phosphine decrease the thermal decomposition rate of silane. Diborane can thus induce substantial uncatalysed silicon growth on the nanowire sidewalls during growth of the wires which can result in a significant increase in the taper rate along the wires during wire growth and dopant incorporation.

Figure 3:
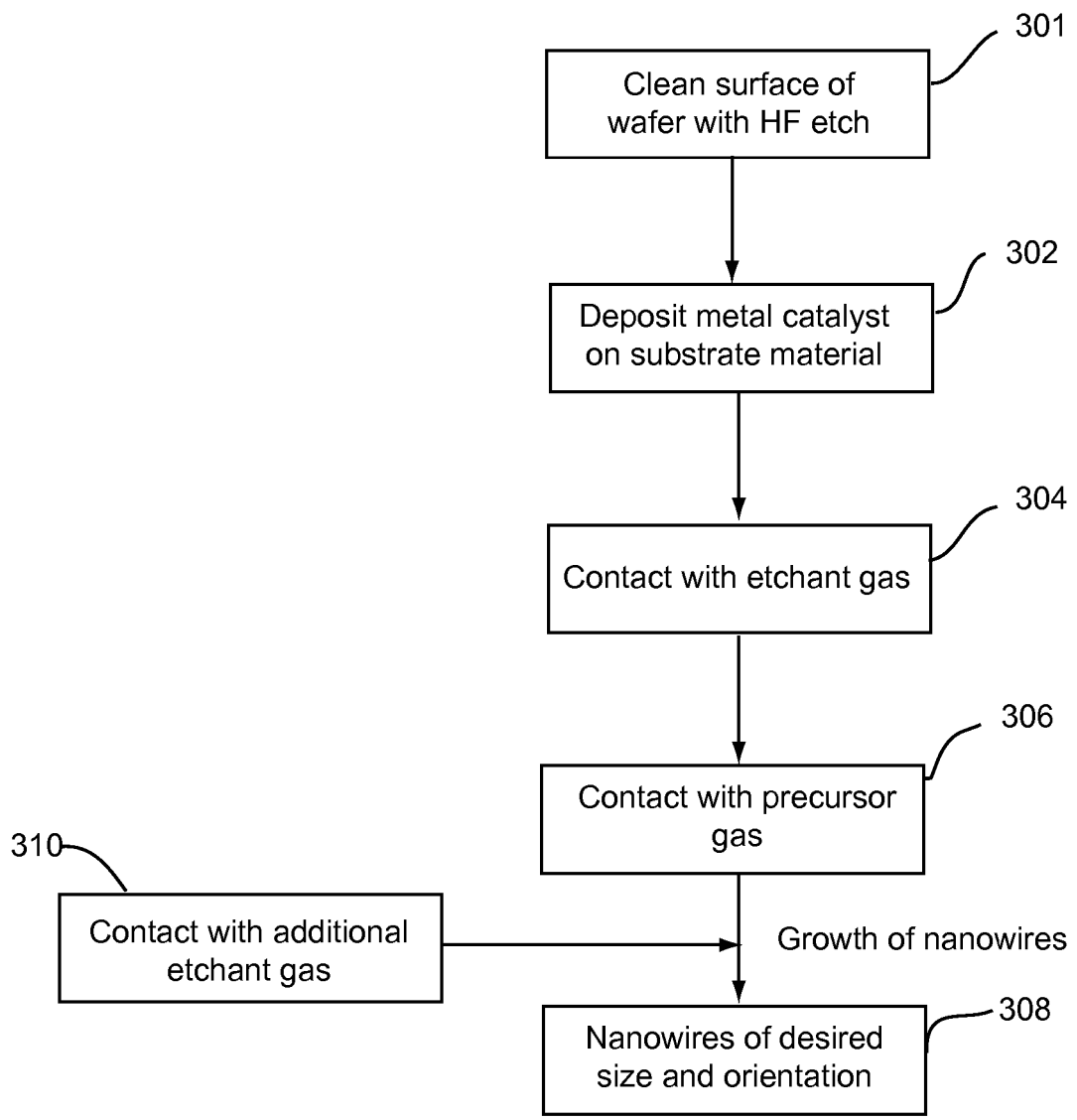
FIG. 3 is a flowchart of a method for preparing nanowires using a combination of an HCl preclean step and introduction of HCl during the nanowire growth process, according to an embodiment of the invention.

Accordingly, in another suitable embodiment of the invention as shown in FIG. 3, an etchant gas such as hydrogen chloride may also be introduced into the reaction chamber during growth of the nanowires and/or during dopant incorporation. Steps 301, 302, 304, 306, and 308 in FIG. 3 are the same as those corresponding steps 201, 202, 204, 206 and 208 of FIG. 2. FIG. 3 also includes the additional step 310 of adding etchant gas, such as HCL, during the wire growth process 306.

The HCl will produce a relatively low etch rate of the wires at the growth temperature of the wires (e.g., about 600° C.). In the growth temperature range of about 600° C. required to grow vertically aligned epitaxial silicon nanowires, it has been observed that the etch rate of silicon with HCl is relatively low, and that the surface of the silicon nanowires may be covered with one or more monolayers of Cl and H. Such a passivation layer can help to minimize sidewall deposition of silicon thus leading to wires with low taper, and can further sterically hinder lattice incorporation of boron (or other dopant gases) into the nanowire sidewalls thus promoting axial dopant incorporation (versus sidewall dopant incorporation which is less desirable). In the embodiment whereby the etchant gas, such as hydrogen chloride, is introduced into the reaction chamber both in the preclean step noted above in FIG. 2 as well as during growth of the wires and/or dopant incorporation, typically the partial pressure of HCl during the preclean step is higher (e.g., about 1.0 Torr) than the partial pressure of HCl introduced into the reaction chamber during the nanowire growth process (e.g., about 0.15 Torr) to minimize over-etching of the wires during growth.

Figure 4A:
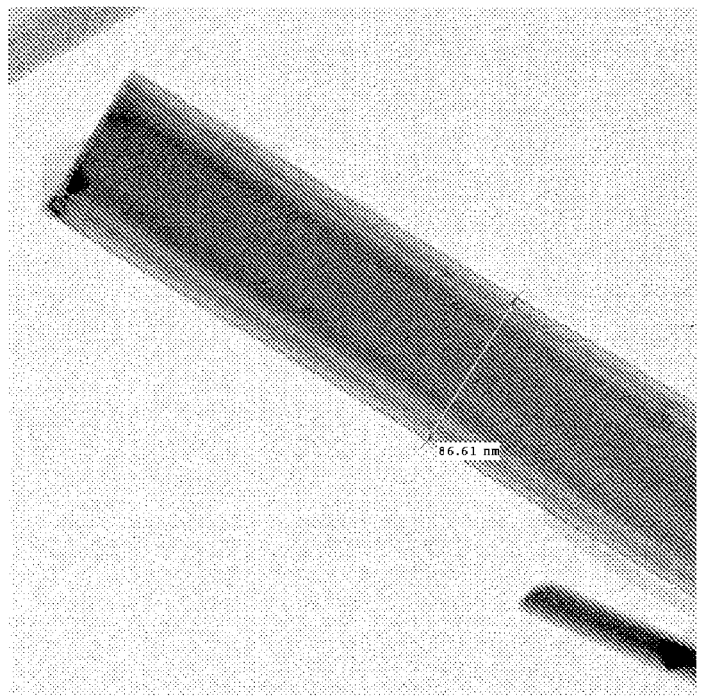
FIG. 4A and 4B are TEMs showing a base (4A) and corresponding tip (4B) of a 21 micron long nanowire having a taper rate of about 0.2 nm/micron grown using a combination of an HCl preclean step and introduction of HCl during the nanowire growth process according to the methods of the present invention.
Figure 4B:
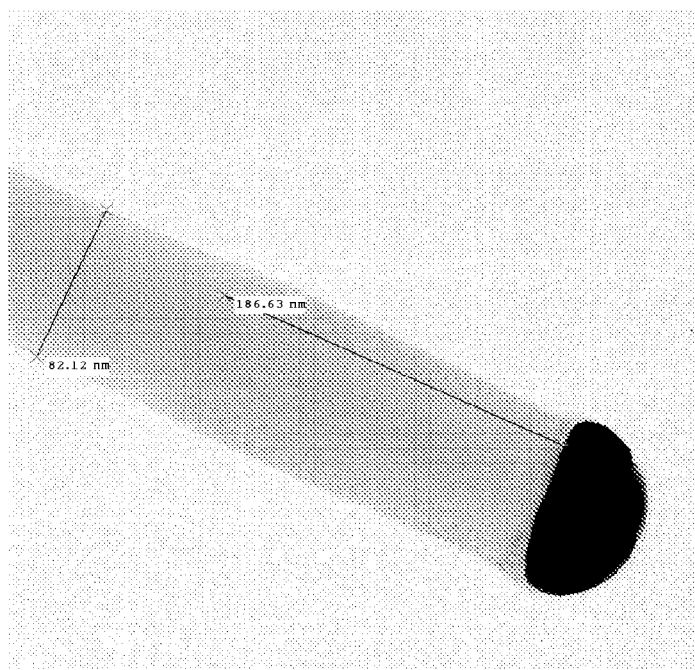

Continuously supplying the precursor gas will allow the nanowire to continue growing until termination by desire or death caused by local condition change. The quality of the nanowires is dependent on the quality of gold nanoparticles, etchant gas concentration, control of gold nanoparticle distribution on the substrate and growth condition including temperature, ratio of dopant to precursor gas, partial pressure of the precursor gas, and resident time of precursor gases in the reactor. It has been found that the methods of the present invention provide nanowires having very low taper along their length, for example, have a taper rate of less than about 2 nm/micron, e.g., less than about 1 nm/micron, e.g., less than about 0.5 nm/micron, e.g., less than about 0.3 nm/micron. In suitable embodiments of the present invention, the processes of the present invention can be accomplished using a computer controlled 8" semiconductor furnace. FIGS. 4A and 4B are a TEMs showing a base (4A) and corresponding tip (4B) of a 21 micron long nanowire having a taper rate of about 0.2 nm/micron grown using a combination of an HCl preclean step and introduction of HCl during the nanowire growth process according to the methods of the present invention.

High quality single-crystalline nanowire heterostructures such as silicon/germanium nanowires can also be grown using the teachings of the present invention. Such wires are commonly grown by metal-catalyzed chemical vapor deposition (CVD), which is based on a vapor-liquid-solid (VLS) growth process. During growth, the process gases (e.g., $SiH_4$ and $GeH_4$) decompose at the catalyst surface, Si (Ge) diffuses in the catalyst, and then when supersaturation occurs, the silicon (germanium) precipitates out at the catalyst-substrate interface to form a silicon/germanium nanowire of diameter similar to that of the catalyst. The main difference between Si and Ge is that vertically aligned epitaxial germanium nanowires can be grown at temperatures approximately 200° C. lower than that for silicon nanowires. This can cause problems when growing Si/Ge and $Si_xGe_{1-x}$ axially modulated structures where uncatalysed thermal decomposition of the GeH4 would lead to sidewall growth producing tapered nanowires at temperatures required for silicon nanowire growth. The germanium added to the sidewall of the nanowire is undesirable since it would result in a radial as well as axial compositional modulation. This would degrade the electronic properties of this compositionally modulated wire.

This VLS growth technique lends itself well to axial modulation of Si and Ge where the transition would be controlled by intermittently introducing and stopping the $SiH_4$ ($GeH_4$) to create the axial modulated growth. According to the teachings of the present invention, controlled amounts of HCl can be provided during growth of the Si/Ge nanowires to enable axial Si/Ge and $Si_xGe_{1-x}$ modulation of vertical nanowires without sidewall growth of the precursor gas species. In the growth temperature range (e.g., approximately 600° C.) required to grow vertically aligned epitaxial silicon nanowires, the etch rate of silicon is very low and the surface of the Si/Ge nanowire is covered with a monolayer of Cl and H. Such a passivation layer prevents the sidewall decomposition of silane (and/or germanium gas). This prevents sidewall deposition on the segment of the nanowire previously grown with a different solid composition of $Si_xGe_{1-x}$. This allows a controlled axial modulation without encasing the nanowire radially with material of a different, undesirable composition.

In suitable embodiments, the precursor gas that is introduced in any of the processes of the present invention may be introduced via Plasma Enhanced Sputter Deposition (or Plasma Enhanced Chemical Vapor Deposition (PECVD)). (See Hofmann et al., "Gold Catalyzed Growth of Silicon Nanowires by Plasma Enhanced Chemical Vapor Deposition," *J. Appl. Phys.* 94:6005-6012 (2003).) The diameter distribution of silicon nanowires of these certain embodiments of the present invention is determined by that of the nucleating particles, e.g., metal (suitably gold) nanoparticles. Commercially available gold colloids can have a diameter distribution of ±10%. The same distribution can be attained in the nanowires. Gold nanoparticles can be split into smaller ones resulting in smaller diameter nanowires, depending on the growth condition. Growth conditions can be optimized to minimize this event. Given a growth condition, the length of nanowires can be controlled by varying duration of the growth. Crystallinity of silicon nanowires and dopant concentration are also growth condition dependent. They can be optimized and controlled together with other important nanowire characteristics.

The nanowires produced according to any of the processes of the present invention will suitably grow out of the plane of the substrate material. Such growth includes nanowires that project out of the plane of the substrate material at any angle with respect to the substrate. For example, nanowires can grow at an angle of about 1° to about 90°, and any angle in between these values, relative to the plane of the substrate material. It is a requirement of the present invention that the nanowires produced by the processes described herein must project out of the plane of the substrate. That is, the nanowires produced by the processes of the present invention must extend off of the plane of the substrate material a distance greater than the dimension of a single molecule. As such, the nanowires produced according to the present invention are distinct from structures such as thin films and quantum dots, which spread on the surface of a substrate material, rather than growing in a manner such that they project out of the plane of the substrate a distance that exceeds the atomic diameter of a single Si molecule for instance.

Suitably, the nanowires produced according to any of the processes of the present invention will project out of the plane of the substrate material so as to attain a final length of about 100 nm to less than about 50 µm, e.g., between about 15 µm to about 25 µm. The nanowires of the present invention will suitably be at least about 1 nm to less than about 1 µm in diameter. For use in electronic devices, the nanowires of the present invention will have a diameter of about a few nms to 100's of nms, so as to allow them to be harvested and utilized in an electronic device (See U.S. application Ser. No. 60/754,520, filed Dec. 29, 2005, for a description of nanowire harvesting which is incorporated herein by reference.)

In suitable embodiments of the present invention, the nanowires, when growing on a crystalline substrate (whether polycrystalline or single crystal) will preferably grow epitaxially. However, the present invention also embodies growth on crystalline substrates wherein the nanowires do not grow in an epitaxial orientation. As used herein, the term epitaxial as it refers to the growth of nanowires means that the nanowires have the same crystallographic characteristic(s) as the substrate material on which they are growing. For example, the orientation of the substrate material can be any crystallographic orientation known to the ordinarily skilled artisan, including, but not limited to, <111>, <110>, <100> and <211>. In suitable embodiments then, the nanowires produced by the processes of the present invention can be grown in any crystallographic orientation, and suitably in the same orientation as the substrate material, including those orientations discussed throughout and as known to the ordinarily skilled artisan.

In other suitable embodiments of the present invention, the crystallographic plane of the substrate material can be off axis of the 0° horizontal plane. The nanowires growing on the surface of such a substrate material can project out of the substrate material at an angle such that the wires can be normal to the crystallographic plane (i.e., 90° with respect to the crystallographic plane) or can be off axis relative to the crystallographic plane such that they can be normal to a 0° horizontal plane.

In embodiments of the present invention where amorphous substrates are utilized, the nanowires produced according to the processes of the present invention will not grow epitaxially, as the amorphous material does not comprise a crystallographic orientation. However, as noted above, the nanowires grown on such substrates may project out of the plane of the substrate at any angle relative to the horizontal plane.

The processes of the present invention produce nanowires that may carry electrons between two points in space and thus act to transfer charge. In this way, the nanowires of the present invention are further distinct from nanodots and in their size and orientation, are distinct from semiconductor films.

The present invention also provides for electronic circuits comprising the nanowires produced by any of the processes of the present invention. Suitably collections of nanowires produced according to the processes of the present invention are useful building blocks for high performance electronics. A collection of nanowires orientated in substantially the same direction will have a high mobility value. Furthermore, nanowires can be flexibly processed in solution to allow for inexpensive manufacture. Collections of nanowires can be easily assembled onto any type of substrate from solution to achieve a thin film of nanowires. For example a thin film of nanowires used in a semiconductor device can be formed to include 2, 5, 10, 100, and any other number of nanowires between or greater than these amounts, for use in high performance electronics.

The nanowires of the present invention can also be used to make high performance composite materials when combined with polymers/materials such as organic semiconductor materials, which can be flexibly spin-cast on any type of substrate. Nanowire/polymer composites can provide properties superior to a pure polymer materials.

Collections or thin films of nanowires of the present invention can be aligned into being substantially parallel to each other, or can be left non-aligned or random. Non-aligned collections or thin films of nanowires provide electronic properties comparable or superior to polysilicon materials, which typically have mobility values in the range of 1-10 $cm^2/V \cdot s$.

Aligned thin films of nanowires of the present invention can be obtained in a variety of ways. For example, aligned thin films of nanowires can be produced by using the following techniques: (a) Langmuir-Blodgett film alignment; (b) fluidic flow approaches, such as described in U.S. Pat. No. 6,872,645, and incorporated herein by reference in its entirety; (c) application of mechanical shear force; and (d) use of AC electric fields as described in U.S. Patent Application Publication 20080224123. Aligned thin films of nanowires/polymer composites can be obtained using these techniques, followed by a spin-casting of the desired polymer onto the created thin film of nanowires. For example, nanowires can be deposited in a liquid polymer solution, alignment can then be performed according to one of these or other alignment processes, and the aligned nanowires can then be cured (e.g., UV cured, crosslinked, etc.). An aligned thin film of nanowires/polymer composite can also be obtained by mechanically stretching a randomly oriented thin film of nanowires/polymer composite.

P-doped nanowires and n-doped nanowires produced by the processes of the present invention can be separately fabricated, and deposited in a homogeneous mixture onto a surface, such as a macroelectronic substrate. On a macroscopic level, the resulting material appears to contain a high concentration of both n- and p-dopants. By creating such a mixture of p- and n-doped nanowires, macroelectronic devices can be fabricated that respond as if they are both n- and p-doped. For example, a resulting thin film of nanowires that includes both n-doped and p-doped nanowires can exhibit characteristics of both n-doped and p-doped nanowires. For example, diode, transistor, and other known electrical devices can be fabricated to include a combination of p-doped nanowires and n-doped nanowires.

Nanowires produced by the processes of the present invention can also be used to produce electrical devices such as p-n diodes, transistors, and other electrical device types, using nanowire heterostructures as described herein. Nanowire heterostructures include a plurality of p-n junctions along the length of the nanowire and can include alternating portions or segments along their lengths that are differently doped.

Use of Nanowires of the Present Invention in Exemplary Devices and Applications

Numerous electronic devices and systems can incorporate semiconductor or other type devices with thin films of nanowires produced by the methods of the present invention. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) can be coupled to signals of other electronic circuits, and/or can be integrated with other electronic circuits. Semiconductor devices can be formed on large substrates, which can be subsequently separated or diced into smaller substrates. Furthermore, on large substrates (i.e., substrates substantially larger than conventional semiconductor wafers), semiconductor devices formed thereon can be interconnected.

The nanowires produced by the processes of the present invention can also be incorporated in applications requiring a single semiconductor device, and to multiple semiconductor devices. For example, the nanowires produced by the processes of the present invention are particularly applicable to large area, macro electronic substrates on which a plurality of semiconductor devices are formed. Such electronic devices can include display driving circuits for active matrix liquid crystal displays (LCDs), organic LED displays, and field emission displays. Other active displays can be formed from a nanowire-polymer, quantum dots-polymer composite (the composite can function both as the emitter and active driving matrix). The nanowires produced by the processes of the present invention are also applicable to smart libraries, credit cards, large area array sensors, and radio-frequency identification (RFID) tags, including smart cards, smart inventory tags, and the like.

The nanowires produced by the processes of the present invention are also applicable to digital and analog circuit applications. In particular, the nanowires produced by the processes of the present invention are useful in applications that require ultra large-scale integration on a large area substrate. For example, a thin film of nanowires produced by the processes of the present invention can be implemented in logic circuits, memory circuits, processors, amplifiers, and other digital and analog circuits.

The nanowires produced by the processes of the present invention can be applied to photovoltaic applications. In such applications, a clear conducting substrate is used to enhance the photovoltaic properties of the particular photovoltaic device. For example, such a clear conducting substrate can be used as a flexible, large-area replacement for indium tin oxide (ITO) or the like. A substrate can be coated with a thin film of nanowires that is formed to have a large bandgap, i.e., greater than visible light so that it would be non-absorbing, but would be formed to have either the HOMO or LUMO bands aligned with the active material of a photovoltaic device that would be formed on top of it. Clear conductors can be located on two sides of the absorbing photovoltaic material to carry away current from the photovoltaic device. Two different nanowire materials can be chosen, one having the HOMO aligned with that of the photovoltaic material HOMO band, and the other having the LUMO aligned with the LUMO band of the photovoltaic material. The bandgaps of the two nanowires materials can be chosen to be much larger than that of the photovoltaic material. The nanowires, according to this embodiment, can be lightly doped to decrease the resistance of the thin films of nanowires, while permitting the substrate to remain mostly non-absorbing.

Hence, a wide range of military and consumer goods can incorporate the nanowires produced by the processes of the present invention. For example, such goods can include personal computers, workstations, servers, networking devices, handheld electronic devices such as PDAs and palm pilots, telephones (e.g., cellular and standard), radios, televisions, electronic games and game systems, home security systems, automobiles, aircraft, boats, other household and commercial appliances, and the like.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A method for axially doping one or more desired portions of a nanowire along a length of the nanowire during growth of said nanowire comprising:
    (a) providing a substrate material having one or more nucleating particles deposited thereon in a reaction chamber;
    (b) pre-cleaning the surface of the substrate material and the nucleating particles by introducing a pre-cleaning etchant gas into the reaction chamber;
    (c) after the pre-cleaning of step (b), contacting the nucleating particles with at least one precursor gas to initiate nanowire growth;
    (d) introducing at least one dopant gas into the reaction chamber during said nanowire growth to dope said one or more desired portions of the nanowire; and
    (e) during and/or prior to said dopant introduction, introducing a non-precursor etchant gas into the reaction chamber at a certain pressure, wherein the etchant gas at the certain pressure is capable of substantially minimizing uncatalysed growth resulting from the at least one precursor gas on a sidewall of the nanowire during said nanowire growth and hindering incorporation of the at least one dopant on a sidewall of the nanowire.

2. The method of claim 1, wherein the pre-cleaning etchant gas comprises hydrogen chloride (HCl).

3. A method for axially doping one or more desired portions of a nanowire along a length of the nanowire during growth of said nanowire comprising:
    (a) providing a substrate material having one or more nucleating particles deposited thereon in a reaction chamber;
    (b) contacting the nucleating particles with at least one precursor gas to initiate nanowire growth;
    (c) introducing at least one dopant gas into the reaction chamber during said nanowire growth to dope said one or more desired portions of the nanowire;
    (d) during and/or prior to said dopant introduction, introducing a non-precursor etchant gas into the reaction chamber at a certain pressure, wherein the etchant gas at the certain pressure is capable of substantially minimizing uncatalysed growth resulting from the at least one precursor gas on a sidewall of the nanowire during said nanowire growth and hindering incorporation of the at least one dopant on a sidewall of the nanowire; and
    (e) controlling the amount of said introduced non-precursor etchant gas to aid in axial dopant modulation of the nanowire.

4. The method of claim 3, wherein the non-precursor etchant gas comprises hydrogen chloride (HCl).

5. A method for axial doping modulation of a nanowire during growth of said nanowire comprising:
    (a) providing a substrate material having one or more nucleating particles deposited thereon in a reaction chamber;
    (b) contacting the nucleating particles with at least one precursor gas to initiate nanowire growth;
    (c) intermittently introducing at least one dopant as into the reaction chamber during said nanowire growth to axially modulate the nanowire doping; and
    (d) introducing a non-precursor etchant gas into the reaction chamber during step (c), wherein the etchant gas is capable of hindering incorporation of the at least one dopant on a sidewall of the nanowire, wherein the non-precursor etchant gas is introduced at a relatively low pressure compared to the pressure of the at least one precursor gas.

6. A method for axial doping modulation of a nanowire during growth of said nanowire comprising:
    (a) providing a substrate material having one or more nucleating particles deposited thereon in a reaction chamber;
    (b) contacting the nucleating particles with at least one precursor gas to initiate nanowire growth;
    (c) intermittently introducing at least one dopant gas into the reaction chamber during said nanowire growth to modulate the nanowire doping;
    (d) introducing a non-precursor etchant, gas into the reaction chamber during step (c), wherein the etchant gas is capable of hindering incorporation of the at least one dopant on a sidewall of the nanowire; and
    (e) controlling the amount of the etchant gas introduced in step (d) depending on the dopant gas to hinder incorporation of the dopant on a sidewall of the nanowire during said axial modulation of the nanowire doping.

* * * * *

UNITED STATES PATENT AND TRADEMARK OFFICE
CERTIFICATE OF CORRECTION

PATENT NO. : 7,776,760 B2  Page 1 of 1
APPLICATION NO. : 11/935884
DATED : August 17, 2010
INVENTOR(S) : David Taylor It is certified that error appears in the above-identified patent and that said Letters Patent is hereby corrected as shown below:

In claim 5, column 18, line 32, after "dopant", please delete "as" and insert --gas--.

In claim 6, column 18, line 51, before "modulate", please insert --axially--.

Signed and Sealed this

Nineteenth Day of October, 2010

David J. Kappos
*Director of the United States Patent and Trademark Office*